United States Patent
Mitikiri et al.

(10) Patent No.: US 11,258,452 B2
(45) Date of Patent: Feb. 22, 2022

(54) KICKBACK COMPENSATION FOR A CAPACITIVELY DRIVEN COMPARATOR

(71) Applicant: TEXAS INSTRUMENTS INCORPORATED, Dallas, TX (US)

(72) Inventors: Yujendra Mitikiri, Hyderabad (IN); Minkle Eldho Paul, Bengaluru (IN); Anukruti Chakraborty, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/039,313

(22) Filed: Sep. 30, 2020

(65) Prior Publication Data

US 2021/0013895 A1    Jan. 14, 2021

Related U.S. Application Data

(63) Continuation of application No. 16/654,062, filed on Oct. 16, 2019, now Pat. No. 10,833,690, which is a continuation of application No. 15/902,092, filed on Feb. 22, 2018, now Pat. No. 10,483,994.

(60) Provisional application No. 62/611,854, filed on Dec. 29, 2017.

(51) Int. Cl.

| H03M 1/06 | (2006.01) |
| H03M 1/08 | (2006.01) |
| H03M 1/46 | (2006.01) |
| H03M 1/00 | (2006.01) |
| H03M 1/12 | (2006.01) |

(52) U.S. Cl.
CPC ........... *H03M 1/08* (2013.01); *H03M 1/0881* (2013.01); *H03M 1/468* (2013.01); *H03M 1/00* (2013.01); *H03M 1/001* (2013.01); *H03M 1/06* (2013.01); *H03M 1/12* (2013.01)

(58) Field of Classification Search
CPC ............ H03M 1/06; H03M 1/12; H03M 1/00; H03M 1/001
USPC ................................. 341/118, 155, 161, 110
See application file for complete search history.

(56) References Cited

U.S. PATENT DOCUMENTS

| 5,581,252 A | 12/1996 | Thomas |
| 2010/0090873 A1* | 4/2010 | Yang .................. H03M 1/1061 341/118 |
| 2012/0280841 A1 | 11/2012 | Wang et al. |

OTHER PUBLICATIONS

International Search Report for corresponding PCT Application No. PCT/US2018/068105 dated Apr. 11, 2019 (2 pages).

\* cited by examiner

*Primary Examiner* — Joseph J Lauture
(74) *Attorney, Agent, or Firm* — John R. Pessetto; Charles A. Brill; Frank D. Cimino

(57) ABSTRACT

An analog-to-digital converter (ADC) includes a comparator, a voltage reference circuit, a first capacitive digital-to-analog converter (CDAC), and a second CDAC. The first CDAC includes a plurality of capacitors. Each of the capacitors of the first CDAC includes a top plate coupled to a first input of the comparator, and a bottom plate switchably coupled to an output of the voltage reference circuit. The second CDAC includes a plurality of capacitors. Each of the capacitors of the second CDAC includes a top plate coupled to a second input of the comparator, and a bottom plate switchably coupled to a ground reference.

5 Claims, 4 Drawing Sheets

KICKBACK COMPENSATION FOR A CAPACITIVELY DRIVEN COMPARATOR

CROSS-REFERENCE TO RELATED APPLICATIONS

This continuation application claims priority to U.S. patent application Ser. No. 16/654,062, filed Oct. 16, 2019, which claims priority to U.S. patent application Ser. No. 15/902,092, filed Feb. 22, 2018 (now U.S. Pat. No. 10,483, 994), which claims priority to and the benefit of Provisional Application No. 62/611,854, filed Dec. 29, 2017, all of which are incorporated herein by reference in their entirety.

BACKGROUND

Analog comparators are relatively common electronic circuits that are used in a wide-variety of applications to compare the amplitude of two signals. Latched comparators area type of comparator that uses positive feedback to maintain an output state of the comparator. For example, output state change of a latched comparator may be triggered by a transition or state of a dock signal. After the output state change, the output state of the comparator is maintained by positive feedback and the remainder of the comparator circuitry may operate at a reduced power level. Latched comparators are often used in event driven or power sensitive applications, such as analog-to-digital converters.

SUMMARY

Circuits that provide kickback compensation for a comparator are disclosed herein. In one embodiment, an analog-to-digital converter (ADC) includes a comparator, a voltage reference circuit, a first capacitive digital-to-analog converter (CDAC), and a second CDAC. The first CDAC includes a plurality of capacitors. Each of the capacitors of the first CDAC includes a top plate coupled to a first input of the comparator, and a bottom plate switchably coupled to an output of the voltage reference circuit. The second CDAC includes a plurality of capacitors. Each of the capacitors of the second CDAC includes a top plate coupled to a second input of the comparator, and a bottom plate switchably coupled to a ground reference. In another embodiment, an ADC includes a CDAC, a comparator, successive approximation circuitry, and edge rate control circuitry. The comparator includes a first input coupled to first output of the CDAC, and a second input coupled to a second output of the CDAC. The successive approximation circuitry is coupled to the comparator and configured to determine a value of each bit of a digital value. The edge rate control circuitry is configured to adjust the edge rate of an output signal of the comparator based on a significance of a bit value being determined by the successive approximation circuitry. The edge rate control circuitry is configured to set the edge rate of the output signal of the comparator higher for a bit of higher significance than for a bit of lower significance.

In a further embodiment, an ADC includes a voltage reference circuit, a first CDAC, a second CDAC, a comparator, successive approximation circuitry, edge rate control circuitry, and bypass circuitry. The first CDAC includes a plurality of capacitors, and a first plurality of switches. Each of the switches of the first plurality of switches of the first CDAC is configured to switchably couple a bottom plate of one of the capacitors of the first CDAC to an output of the voltage reference circuit. The second CDAC includes a plurality of capacitors; and a first plurality of switches. Each of the switches of the first plurality of switches of the second CDAC is configured to switchably couple a bottom plate of one of the capacitors of the second CDAC to a ground reference. The comparator includes a first input coupled to an output of the first CDAC, and a second input coupled to an output of the second CDAC. The successive approximation circuitry is coupled to the comparator, the first CDAC and the second CDAC. The successive approximation circuitry is configured to determine a value of each bit of a digital value, and based on the digital value, to activate at least some switches of the first plurality of switches of the first CDAC. For each switch of the first plurality of switches of the first CDAC activated, the successive approximation circuitry is configured to activate a corresponding switch of the first plurality of switches of the second CDAC. The edge rate control circuitry is configured to adjust the edge rate of an output signal of the comparator based on a significance of a bit value being determined by the successive approximation circuitry. The bypass circuitry is configured to route current generated by switching in a latch of the comparator away from the first input of the comparator and the second input of the comparator.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

While latched comparators may be preferred in many applications, the use of latched comparators can present issues in some applications. For example, when the output of the comparator changes state the large signal swing can induce noise (e.g., kickback) on the inputs of the comparator and the outputs of a circuit connected to the inputs of the comparator. The noise can introduce error into the comparison. Driving the comparator's inputs with a capacitive source, for example by a charge redistribution capacitive digital-to-analog converter (CDAC) of a successive approximation analog-to-digital converter (ADC), may aggravate the effects of kickback from the comparator.

Figure 1:
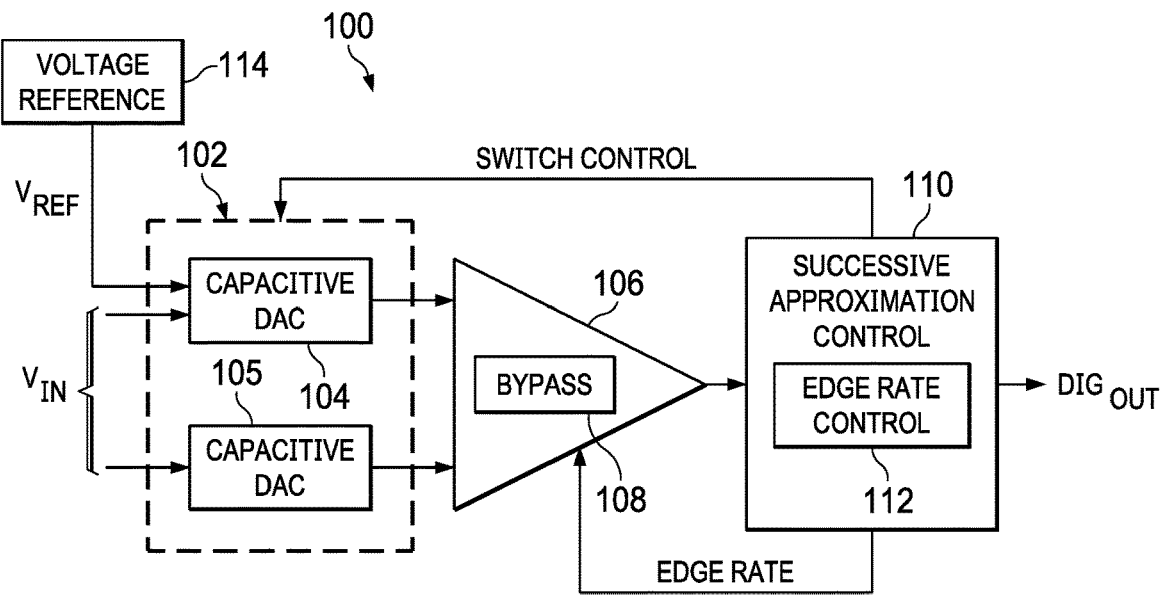
FIG. 1 shows a block diagram for a successive approximation analog-to-digital converter (ADC) that includes a capacitive digital-to-analog converter (CDAC) and kickback compensation circuitry in accordance with various embodiments.

FIG. 1 shows a block diagram for a successive approximation ADC 100 in accordance with various embodiments. The ADC 100 includes a differential CDAC 102, a comparator 106, and successive approximation control circuitry 110. The successive approximation control circuitry 110 is coupled to the comparator 106 and to the CDAC 102, and includes circuitry that controls the various components of the ADC 100 to manage conversion of the input signal $V_{IN}$ to digital values $DIG_{OUT}$. For example, the successive approximation control circuitry 110 may include a state machine that generates control signals for the differential CDAC 102, the comparator 106, and/or other components of the ADC 100 to determine a value of each bit of the digital value $DIG_{OUT}$. The successive approximation control circuitry 110 also includes a successive approximation register that stores bit values generated during digitization.

To reduce the power consumed by the ADC 100, the comparator 106 may be a latching comparator that remains in a low-power state until directed to examine the comparator input signals and produce a change in output state. For example, a clock signal generated by the successive approximation control circuitry 110 may control when the comparator 106 is in a low-power state and when the comparator 106 is active to produce a change in output state. The change in current flowing in the comparator during an output state change may introduce kickback noise on the inputs of the comparator 106.

The differential CDAC 102 includes CDAC 104 and CDAC 105, each of which receives one of the complementary analog signals that make up $V_{IN}$ and provides a sample of the analog signal to the comparator 106. The signal portion of $V_{IN}$ received as input by the CDAC 104 includes the information to be digitized, and the signal portion of $V_{IN}$ received as input by the CDAC 105 provides a reference (e.g., a ground) for measurement of the signal input to the CDAC 104. The output of the CDAC 104 is connected to a first input of the comparator 106, and the output of the CDAC 105 is connected to a second input of the comparator 106. Each of the CDACs 104, 105 includes an array of binary weighted capacitors connected to the comparator 106 and switchably connected to the input signal and one or more reference voltages. Thus, the differential CDAC 102 is a capacitive drive source that may be affected by kickback generated in the comparator 106. The successive approximation control circuitry 110 is coupled to the CDAC 104 and to the CDAC 105.

Figure 2:
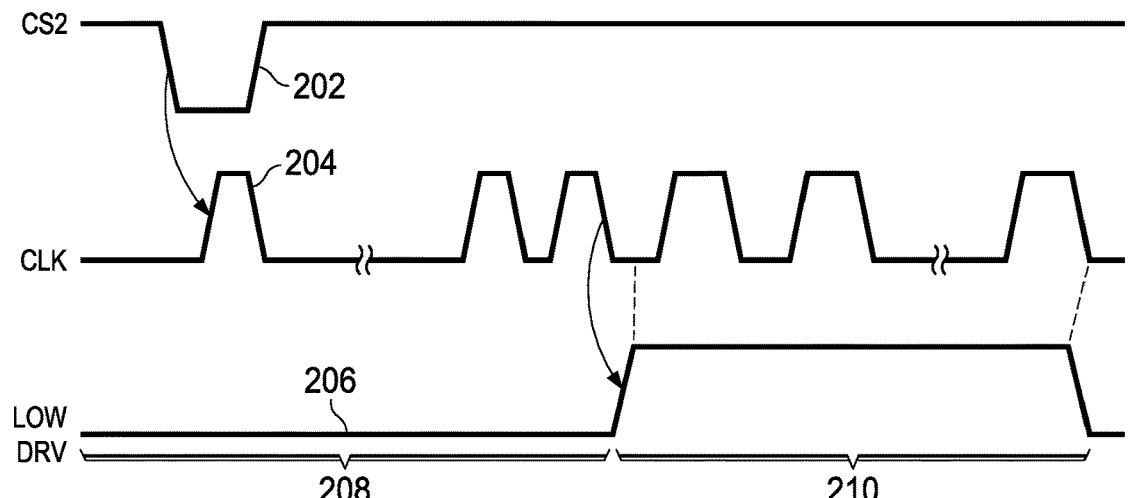
FIG. 2 shows a timing diagram for signals used to control edge rate in a comparator of a successive approximation ADC in accordance with various embodiments.

The ADC 100 includes a variety of features that alleviate the effects of kickback caused by comparator switching. Some embodiments of the successive approximation control circuitry 110 include edge rate control circuitry 112. The term "edge rate" refers to the rate of change of a rising and/or falling transition of a signal. A higher edge rate corresponds to a faster transition and a lower edge rate corresponds to a slower transition. The edge rate control circuitry 112 controls the timing of edge transitions in the comparator 106. FIG. 2 shows a timing diagram for signals used to control edge rate of the comparator 106 by the edge rate control circuitry 112. The signal 202 (CS2) represents the start of an analog-to-digital conversion in the ADC 100. Each pulse of the clock signal 204 (CLK) represents the selection of bit value (i.e., a potential change in output state of the comparator 106) of a digitized input signal.

The edge rate control circuitry 112 varies the edge rate of the output of the comparator 106 during the selection of bit values of an output of the ADC 100. In the successive approximation process, the bit values of higher significance are selected first and the bit values of lower significance are selected later. Accordingly, each successive clock cycle following the pulse 202 represents selection of a bit value of lower significance than the preceding bit. The edge rate control circuitry 112 may vary the edge rate of the comparator output based on the significance of the bit value currently being selected. For example, the edge rate control circuitry 112 may set the comparator 106 to generate a faster output edge rate when bits of higher significance are being selected and to generate a slower output edge rate when bits of lower significance are being selected. Some embodiments of the comparator 106 may include circuitry to control the output edge rate by changing the current flow in the switching transistors (e.g., providing reduced current to reduce the edge rate) of the comparator 106. By reducing the edge rate during selection of bit values of lower significance, the kickback produced by comparator output state change is reduced during selection of bit values of lower significance, and in turn the effects of the kickback on the lower output voltages produced by the CDAC 102 during selection of the lower significance bit values is reduced.

The signal 206 (LOW DRV), which may be generated in the edge rate control circuitry 112, controls the output edge rate of the comparator 106. While the signal 206 is asserted the edge rate of the comparator output is reduced relative to the edge rate of the comparator output produced while the signal 206 is not asserted. The edge rate control circuitry 112 does not assert the signal 206 in interval 208 while bits of higher significance are being selected, and asserts the signal 206 in interval 210 while bits of lower significance are being selected. Thus, the edge rate control circuitry 112 reduces the effects of kickback during selection of bits that are most sensitive to kickback noise by reducing the edge rate of comparator output signal during bit selection.

Figure 3:
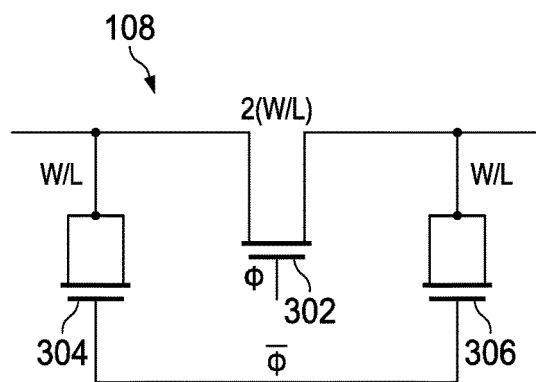
FIG. 3 shows a schematic diagram of circuitry for bypassing kickback current in a comparator in accordance with various embodiments.

Some embodiments of the comparator 106 include bypass circuitry 108. The bypass circuitry 108 shunts kickback current away from the inputs of the comparator 106. FIG. 3 shows a schematic diagram of bypass circuitry 108 in accordance with various embodiments. The bypass circuitry 108 includes a switching transistor 302, and transistors 304 and 306 connected as capacitors on either side of the switching transistor 302. Each of the transistors 304 and 306 may be half the size of the transistor 302. The control terminals of the transistors 304 and 306 are driven by an inverted version of the signal driving the control terminal of the switching transistor 302. The transistors 304 and 306 shunt kickback current away from the inputs of the comparator 106.

The comparator 106 is differentially driven by the differential CDAC 102. Mismatch in the impedances at the comparator's inverting and non-inverting inputs can cause kickback generated in the comparator 106 that propagates to the comparator's inputs to be converted from common-mode to differential signal, thereby affecting comparison of the signal at the comparator's inputs. The differential CDAC 102 includes circuitry to equalize (i.e., reduce the mismatch in) the impedances seen at the inputs of the comparator 106, and thereby reduce the effects of kickback generated in the comparator 106.

Figure 4:
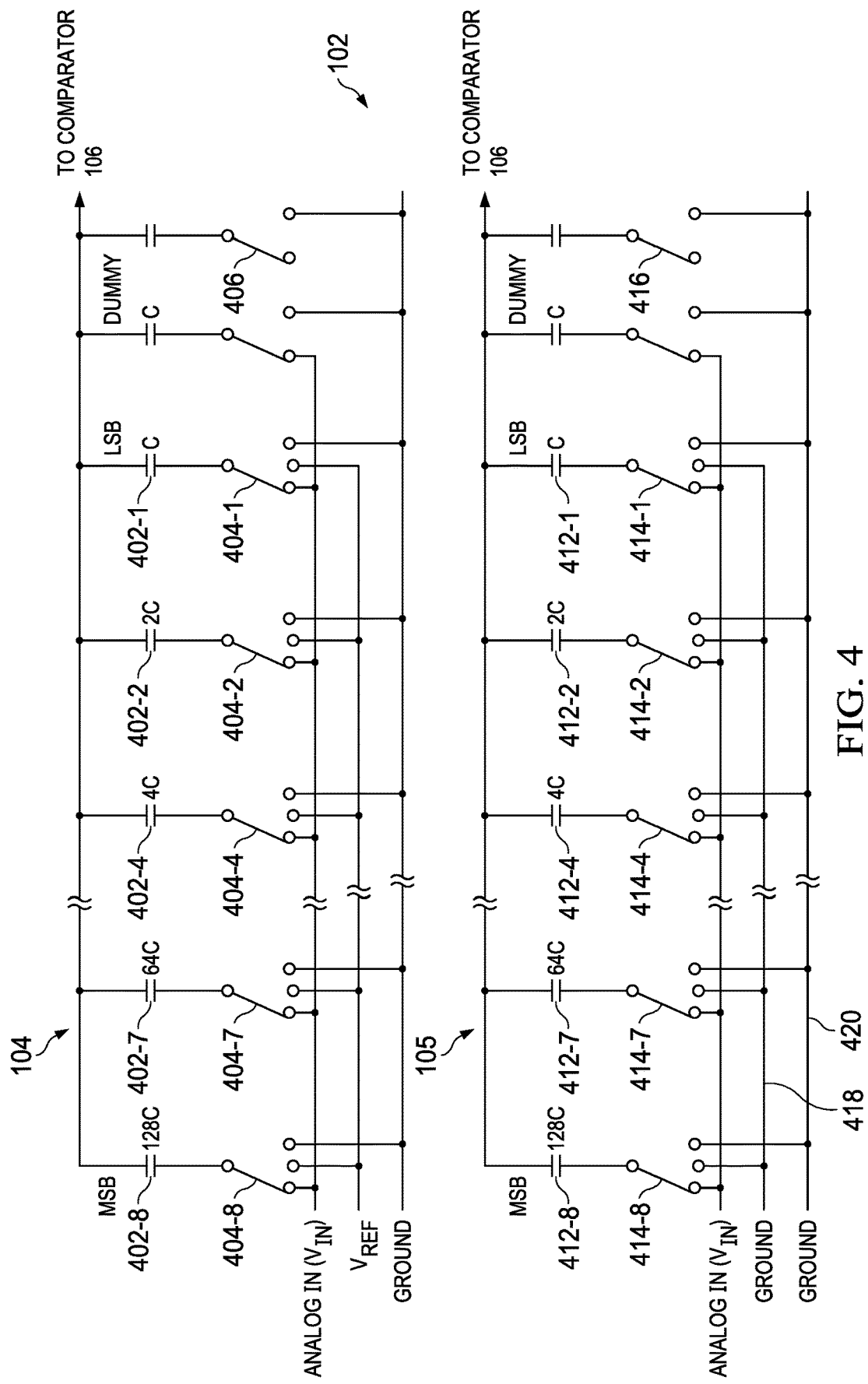
FIG. 4 shows a schematic diagram of circuitry for a differential CDAC that reduces the impedance mismatch between signal inputs of a comparator in accordance with various embodiments.

FIG. 4 shows a schematic diagram of the differential CDAC 102 in accordance with various embodiments. The differential CDAC 102 includes CDAC 104 and CDAC 105. The CDAC 104 includes a plurality of capacitors 402 and a plurality of switches 404. One capacitor 402 corresponds to each bit of the DAC 104. While, the CDAC 104 is illustrated as an 8-bit CDAC, various embodiments of the capacitive CDAC 104 may include a different number of bits and a corresponding number of capacitors 402. In the CDAC 104, the capacitor 402-1 has capacitance C (capacitance of a unit capacitor) and corresponds to the least significant bit of the CDAC 104. That is, the capacitor 402-1 is made up of one unit capacitor. Each successive capacitor 402 of the CDAC 104 has double the capacitance (e.g., double the number of unit capacitors) of the capacitor corresponding to the next lower bit. Accordingly, capacitor 402-2 has capacitance 2C (2 unit capacitors), capacitor 402-4 has capacitance 4C (4 unit capacitors), capacitor 402-7 has capacitance 64C (64 unit capacitors), and capacitor 402-7 has capacitance 128C (128 unit capacitors). The capacitors 402 are coupled to switches 404 that switchably connect the bottom plates of the capacitors 402 to $V_{IN}$, $V_{REF}$, ground, or another voltage.

In the CDAC 104, the switch 404-1 switchably connects the capacitor 402-1 to $V_{IN}$, $V_{REF}$, or a reference voltage (ground in FIG. 4). The switch 404-2 switchably connects the capacitor 402-2 to $V_{IN}$, $V_{REF}$, or ground. The switch 404-4 switchably connects the capacitor 402-4 to $V_{IN}$, $V_{REF}$, or ground. The switch 404-7 switchably connects the capacitor 402-7 to $V_{IN}$, $V_{REF}$, or ground. The switch 404-8 switchably connects the capacitor 402-8 to $V_{IN}$, $V_{REF}$, or ground. The switch 406 switchably connects the top plate of the capacitors 402 to ground. Control signals generated by the successive approximation control circuitry 110 control the switches 404. During the digitization process, some switches 404 may connect the corresponding capacitor 402 to $V_{REF}$, and some switches 404 may connect the corresponding capacitor 402 to ground, depending on the voltage of the signal $V_{IN}$ being digitized.

The CDAC 105 includes a plurality of capacitors 412 and a plurality of switches 414. One capacitor 412 corresponds to each bit of the DAC 105. While, the CDAC 105 is illustrated as an 8-bit CDAC, various embodiments of the capacitive CDAC 105 may include a different number of bits and a corresponding number of capacitors 412. In the CDAC 105, the capacitor 412-1 has capacitance C and corresponds the least significant bit of the DAC. That is, the capacitor 412-1 is made up of one unit capacitor. Each successive capacitor 412 of the CDAC 105 has double the capacitance (e.g., double the number of unit capacitors) of the capacitor corresponding to the next lower bit. Accordingly, capacitor 412-2 has capacitance 2C (2 unit capacitors), capacitor 412-4 has capacitance 4C (4 unit capacitors), capacitor 412-7 has capacitance 64C (64 unit capacitors), and capacitor 412-7 has capacitance 128C (128 unit capacitors). The capacitors 412 are coupled to switches 414 that switchably connect the bottom plates of the capacitors 412 to $V_{IN}$ or ground.

In the CDAC 105, the switch 414-1 switchably connects the capacitor 412-1 to $V_{IN}$, or one of two ground connections. The switch 414-2 switchably connects the capacitor 412-2 to $V_{IN}$ or one of two ground connections. The switch 414-4 switchably connects the capacitor 412-4 to $V_{IN}$ or one of two ground connections. The switch 414-7 switchably connects the capacitor 412-7 to $V_{IN}$ or one of two ground connections. The switch 414-8 switchably connects the capacitor 412-8 to $V_{IN}$ or one of two ground connections. The switch 416 switchably connects the top plate of the capacitors 412 to ground. Control signals generated by the successive approximation control circuitry 110 control the switches 414. During the digitization process, all of the switches 414 connect the corresponding capacitor 402 to either ground 418 or ground 420, depending on the voltage of the signal $V_{IN}$ being digitized. In various implementations, the routing parasitics (e.g., parasitic capacitance) associated with the ground 418 are the same as the routing parasitics associated with $V_{REF}$ in the CDAC 104, and the routing parasitics associated with the ground 420 are the same as the routing parasitics associated with the GROUND in the CDAC 104. Thus, the routing parasitics are matched at the two inputs of the comparator 106 to reduce impedance mismatch.

Figure 5:
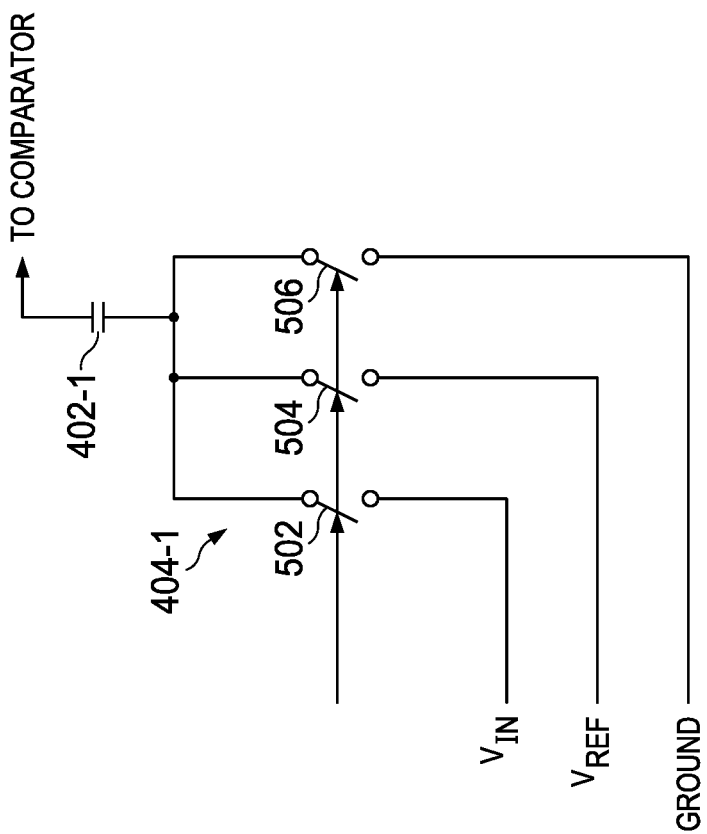

Each of the triple throw switches 404 and 414 of FIG. 4 are implemented using three single throw switches. FIG. 5 shows the switch connections for the capacitor 402-1 and corresponding switch 404-1. The switch 404-1 includes switches 502, 504, and 506. The switch 502 switchably connects the capacitor 402-1 to the input signal $V_{IN}$. The switch 504 switchably connects the capacitor 402-1 (e.g., the bottom plate of the capacitor 402-1) to the output ($V_{REF}$) of a voltage reference circuit 114. The switch 506 switchably connects the capacitor 402-1 to ground. Each of the unit capacitors that make up one of the capacitors 402 may be switchable connected to $V_{IN}$, $V_{REF}$, or ground via an instance of the switches 502, 504, and 506.

Figure 6:
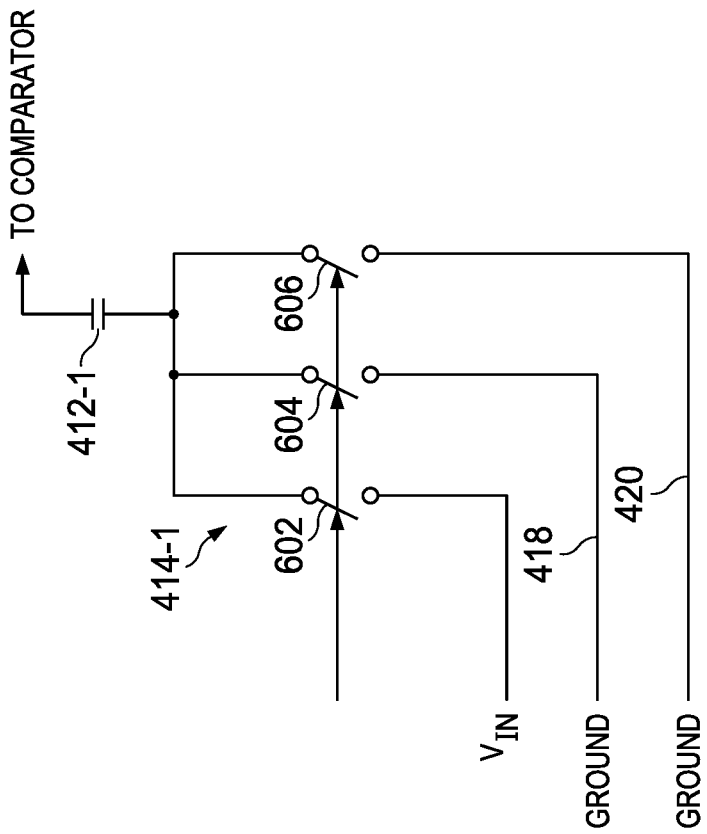
FIGS. 5 and 6 show switch connections in a differential CDAC that reduces the impedance mismatch between signal inputs of a comparator in accordance with various embodiments.

Similarly, FIG. 6 shows the switch connections for the capacitor 412-1 and the corresponding switch 414-1. The switch 414-1 includes switches 602, 604, and 606. The switch 602 switchably connects the capacitor 412-1 to the input signal $V_{IN}$. The switches 604 and 606 switchably connect the capacitor 412-1 (e.g., the bottom plate of the capacitor 412-1) to ground. Each of the unit capacitors that make up one of the capacitors 412 may be switchable connected to $V_{IN}$, or ground via an instance of the switches 602, 604, and 606. Each of the switches 502, 504, 506, 602, 604, and 606 may be implemented by a transistor, such as a metal oxide semiconductor field effect transistor.

To equalize the impedance the CDAC 102 presents on the input terminals of the comparator 106, the successive approximation control circuitry 110 sets the switches 404 and 414 of the CDACs 104 and 105, such that the switches 414 of the CDAC 105 mirror the switch selections of the CDAC 104. For example, if each unit capacitor of the capacitor 402-8 is connected to $V_{REF}$ via a corresponding switch 504, then each unit capacitor of the capacitor 412-8 is connected to ground via a corresponding switch 604. Similarly, if each unit capacitor of the capacitor 402-7 is connected to ground via a corresponding switch 506, then each unit capacitor of the capacitor 412-7 is connected to ground via a corresponding switch 606.

Figure 7:
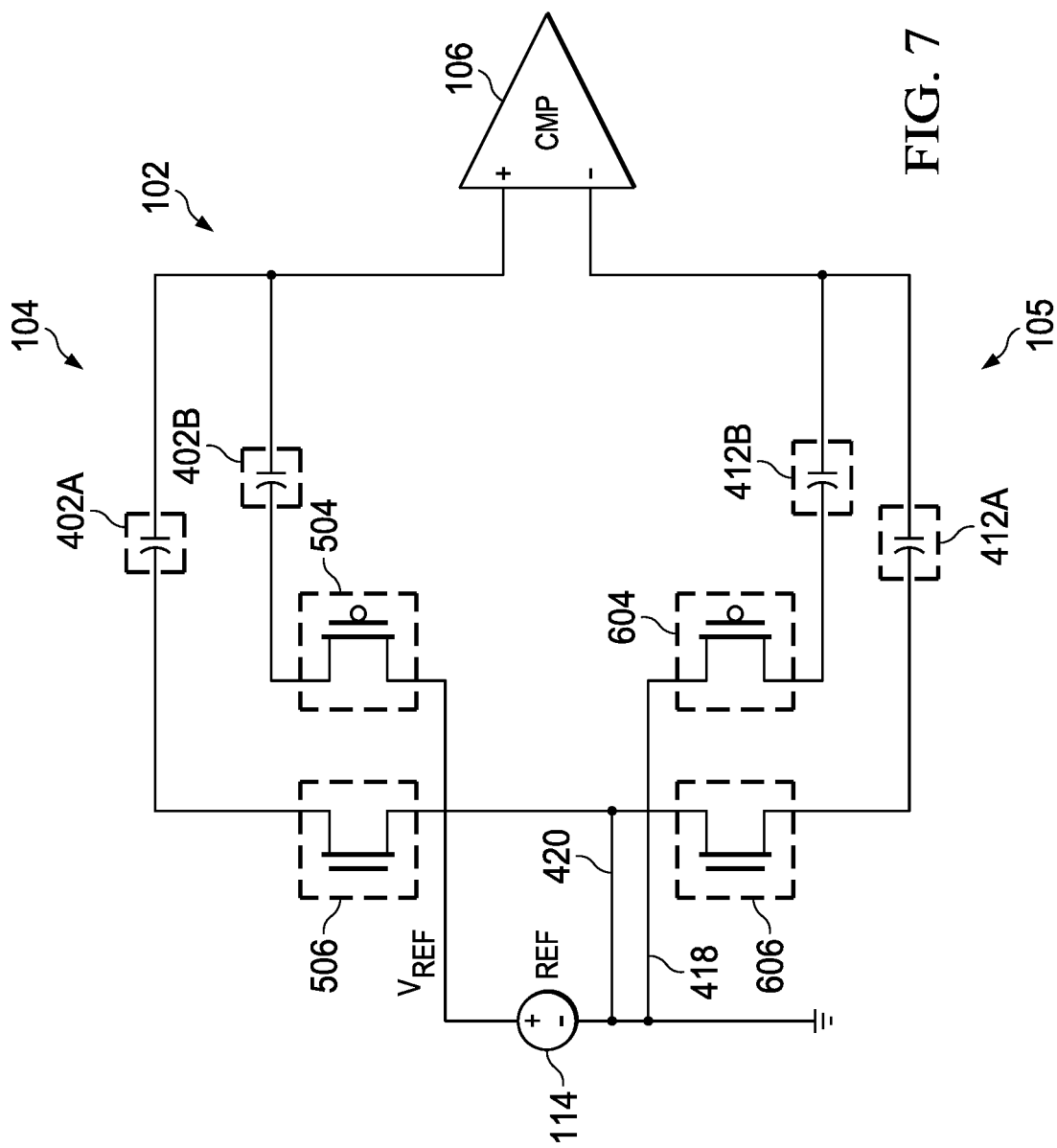
FIG. 7 shows connection of the capacitors of a CDAC to a comparator and reference voltages for reducing impedance mismatch in a successive approximation ADC in accordance with various embodiments.

FIG. 7 shows connection of the capacitors 402 and 412 of the differential CDAC 102 to the comparator 106 and reference voltages for reducing impedance mismatch in accordance with various embodiments. The voltage reference circuit 114 produces as output the voltage $V_{REF}$. The CDAC 104 is coupled to the "+" input terminal of the comparator 106, and the CDAC 105 is coupled to the "−" input terminal of the comparator 106. Accordingly, the top plates of the capacitors 402 are coupled to the "+" input terminal of the comparator 106, and the top plates of the capacitors 412 are coupled to the "−" input terminal of the comparator 106. In FIG. 7, capacitors 402A and 402B collectively represent all of the capacitors 402 of the CDAC 104, with capacitors 402A including all of the unit capacitors of the capacitors 402 that are switchable connected to ground via a switch 506, and capacitors 402B including all of the unit capacitors of the capacitors 402 that are switchable connected to $V_{REF}$ via a switch 504.

Similarly, capacitors 412A and 412B collectively represent all of the capacitors 412 of the CDAC 105, with capacitors 412A including all of the unit capacitors of the capacitors 412 that are switchable connected to ground via a switch 606, and capacitors 412B including all of the unit capacitors of the capacitors 412 that are switchable connected to ground via a switch 604. For each capacitor 402 (i.e., each unit capacitor) of the CDAC 104 coupled to ground via a switch 506, the corresponding capacitor 412 (the corresponding unit capacitor) of the CDAC 105 is coupled to ground 420 via a switch 606. For each capacitor 402 (i.e., each unit capacitor) of the CDAC 104 coupled to $V_{REF}$ via a switch 504, the corresponding capacitor 412 (the corresponding unit capacitor) of the CDAC 105 is coupled to ground 418 via a switch 604. For example, if the 128 unit capacitors of capacitor 402-8 are connected to $V_{REF}$ via the switches 504 corresponding to the unit capacitors, then the 128 unit capacitors of capacitor 412-8 are connected to ground via the switches 604 corresponding to the unit capacitors. Similarly, if the 128 unit capacitors of capacitor 402-8 are connected to ground via the switches 506 corresponding to the unit capacitors, then the 128 unit capacitors of capacitor 412-8 are connected to ground via the switches 606 corresponding to the unit capacitors. The separate grounds 418 and 420 are provided in the CDAC 105 to match the routing parasitics associated with the $V_{REF}$ and ground routing in the CDAC 104.

As successive approximation progresses, the number of capacitors included in 402A may decrease, and the number of capacitors included in 402B may correspondingly increase by selective operation of the switches 504 and 506 as controlled by the successive approximation control circuitry 110. The number of capacitors included in 412A will decrease, and the number of capacitors included in 412B will correspondingly increase with changes in 402A and 402B. By switching capacitors 402, 412 coupled to both the non-inverting and inverting inputs of the comparator 106, the impedance seen at the inputs of the comparator 106 is equalized and conversion of kickback noise from common mode to differential mode is reduced. In turn, the effects of kickback noise on comparator operation are reduced and the accuracy of digitization is enhanced.

Thus, in the ADC 100, information regarding the amplitude of the signal $V_{IN}$ is provided to the comparator 106 via the output of the CDAC 104, and a reference signal (e.g., ground) is provided to the comparator 106 via the output of the CDAC 105. Because the switch connections to ground in the CDAC 105 reflect the switch connections to $V_{REF}$ and ground in the CDAC 104, the routing parasitics seen at the output of the CDAC 105 closely match the routing parasitics seen at the output of the CDAC 104, and the resulting matched impedances at the inputs of the comparator 106 reduces the differential voltage caused by kickback in the comparator 106. In contrast, an ADC that lacks the matched CDAC switching disclosed herein will have an impedance mismatch at the inputs of the comparator and will be more susceptible to kickback induced voltage at the comparator's inputs.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
a comparator having a first input and a second input;
a voltage reference circuit having an output;
a first capacitive digital-to-analog converter (CDAC) comprising:
a plurality of capacitors, each comprising:
a top plate coupled to the first input of the comparator; and
a bottom plate switchably coupled to the output of the voltage reference circuit, a first ground reference or an analog input;
a second CDAC comprising:
a plurality of capacitors, each comprising:
a top plate coupled to the second input of the comparator; and
a bottom plate switchably coupled to a second ground reference, a third ground reference, or the analog input.

2. The ADC of claim 1, wherein:
the first CDAC comprises a first plurality of switches, each of the switches configured to switchably couple the bottom plate of one of the capacitors of the first CDAC to the output of the voltage reference circuit;
the second CDAC comprises a first plurality of switches, each of the switches configured to switchably couple the bottom plate of one of the capacitors of the second CDAC to the second ground reference.

3. The ADC of claim 2, wherein:
the first CDAC comprises a second plurality of switches, each of the switches configured to switchably couple the bottom plate of one of the capacitors of the first CDAC to the first ground reference;
the second CDAC comprises a second plurality of switches, each of the switches configured to switchably couple the bottom plate of one of the capacitors of the second CDAC to the second ground reference.

4. The ADC of claim 3, wherein the second plurality of switches of the second CDAC is configured to couple capacitors of the second CDAC to the third ground reference in conjunction with the second plurality of switches of the first CDAC being set to couple capacitors of the first CDAC to the first ground reference.

5. The ADC of claim 2, wherein the first plurality of switches of the second CDAC is configured to couple capacitors of the second CDAC to the second ground reference in conjunction with the first plurality of switches of the first CDAC being set to couple capacitors of the first CDAC to the output of the voltage reference circuit.

* * * * *